(12) United States Patent
Lee et al.

(10) Patent No.: US 12,444,718 B2
(45) Date of Patent: Oct. 14, 2025

(54) SEMICONDUCTOR DEVICE AND METHOD OF FORMING COMPARTMENT SHIELDING FOR A SEMICONDUCTOR PACKAGE

(71) Applicant: JCET STATS ChipPAC Korea Limited, Incheon (KR)

(72) Inventors: SeungHyun Lee, Incheon (KR); YeJin Park, Incheon (KR); HeeSoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 420 days.

(21) Appl. No.: 18/187,911

(22) Filed: Mar. 22, 2023

(65) Prior Publication Data

US 2024/0321845 A1 Sep. 26, 2024

(51) Int. Cl.
| | |
|---|---|
| *H01L 25/16* | (2023.01) |
| *H01L 21/56* | (2006.01) |
| *H01L 23/00* | (2006.01) |
| *H01L 23/31* | (2006.01) |
| *H01L 23/48* | (2006.01) |
| *H01L 23/522* | (2006.01) |
| *H01L 23/552* | (2006.01) |
| *H01L 23/64* | (2006.01) |

(Continued)

(52) U.S. Cl.
CPC ............ *H01L 25/16* (2013.01); *H01L 21/561* (2013.01); *H01L 21/565* (2013.01); *H01L 23/3107* (2013.01); *H01L 23/481* (2013.01); *H01L 23/552* (2013.01); *H01L 24/08* (2013.01); *H01L 24/16* (2013.01); *H01L 24/81* (2013.01); *H01L 24/94* (2013.01); *H10D 1/47* (2025.01); *H01L 2224/08112* (2013.01); *H01L 2224/16235* (2013.01); *H01L 2224/81191* (2013.01); *H01L 2224/94* (2013.01); *H01L 2924/182* (2013.01)

(58) Field of Classification Search
CPC ...... H01L 25/16; H01L 21/561; H01L 21/565; H01L 23/3107; H01L 23/481; H01L 23/552; H01L 24/08; H01L 24/16; H01L 24/81; H01L 24/94; H01L 2224/08112; H01L 2224/16235; H01L 2224/81191; H01L 2224/94; H01L 2924/182; H01L 23/5225; H01L 23/31; H01L 21/56; H01L 23/647; H01L 23/3121; H01L 25/0655; H10D 1/47
See application file for complete search history.

(56) References Cited

U.S. PATENT DOCUMENTS

| | | | |
|---|---|---|---|
| 2017/0077039 A1* | 3/2017 | Liao | H01L 23/552 |
| 2019/0088621 A1* | 3/2019 | Yang | H01L 25/0657 |
| 2021/0091017 A1 | 3/2021 | Yeon et al. | |

(Continued)

*Primary Examiner* — Herve-Louis Y Assouman
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A first electrical component and second electrical component are disposed over the substrate. A zero-ohm resistor is disposed over the substrate between the first electrical component and second electrical component. An encapsulant is deposited over the substrate, first electrical component, second electrical component, and first zero-ohm resistor. An opening is formed through the encapsulant to the first zero-ohm resistor. A shielding layer is formed over the encapsulant and into the opening.

19 Claims, 13 Drawing Sheets

(51) Int. Cl.
*H01L 25/065* (2023.01)
*H10D 1/47* (2025.01)

(56) References Cited

U.S. PATENT DOCUMENTS

2021/0366838 A1 11/2021 Han et al.
2022/0013472 A1 1/2022 Han et al.

* cited by examiner

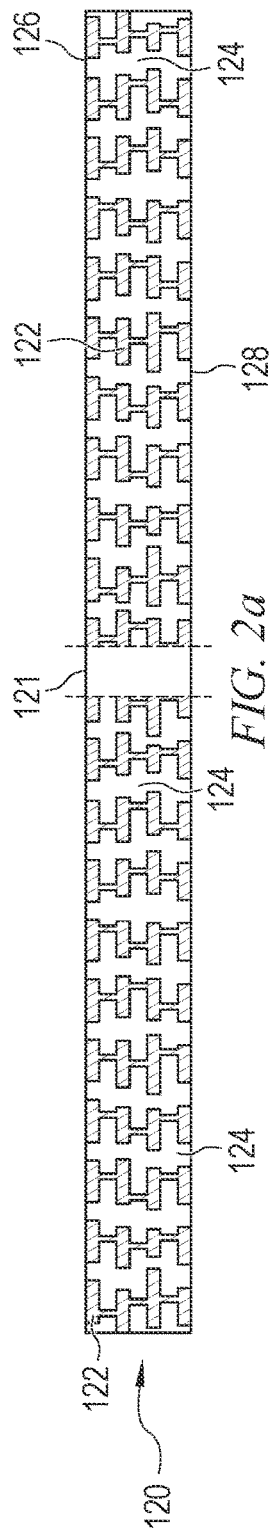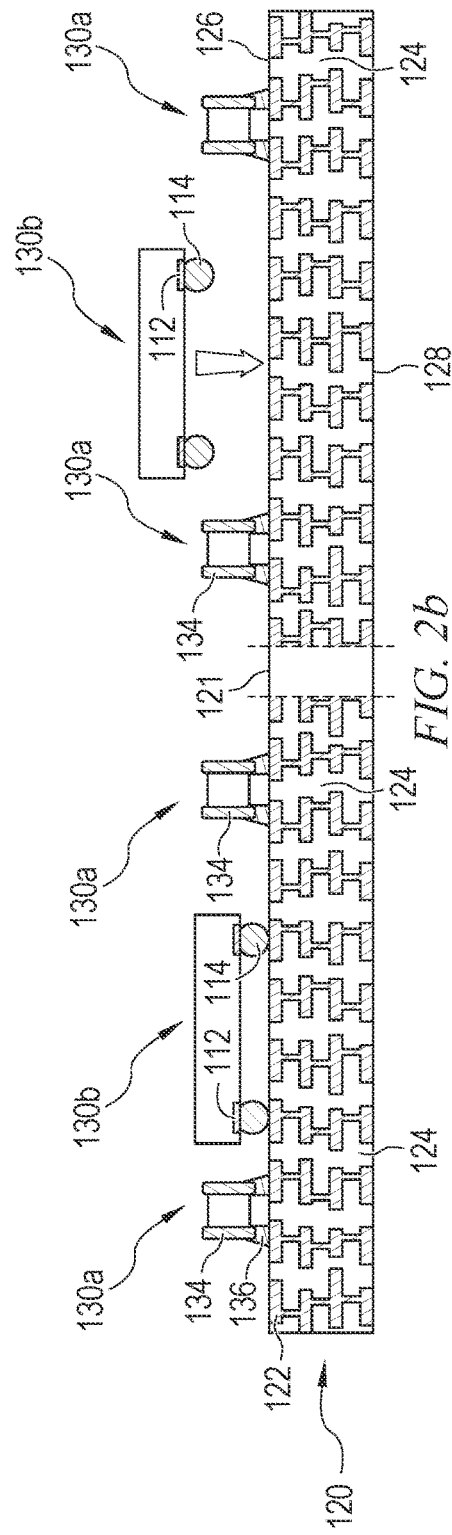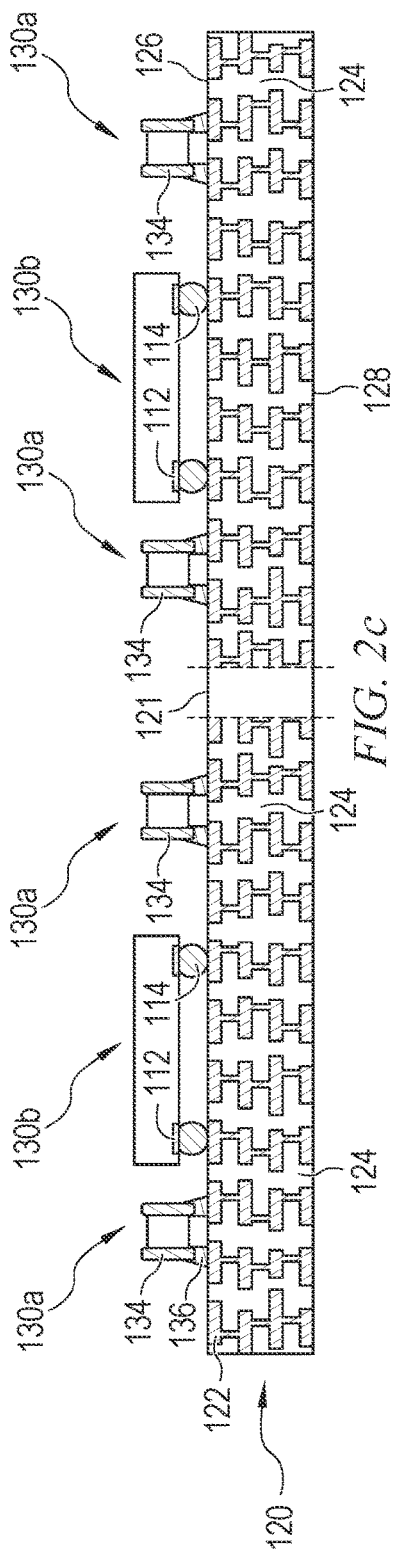

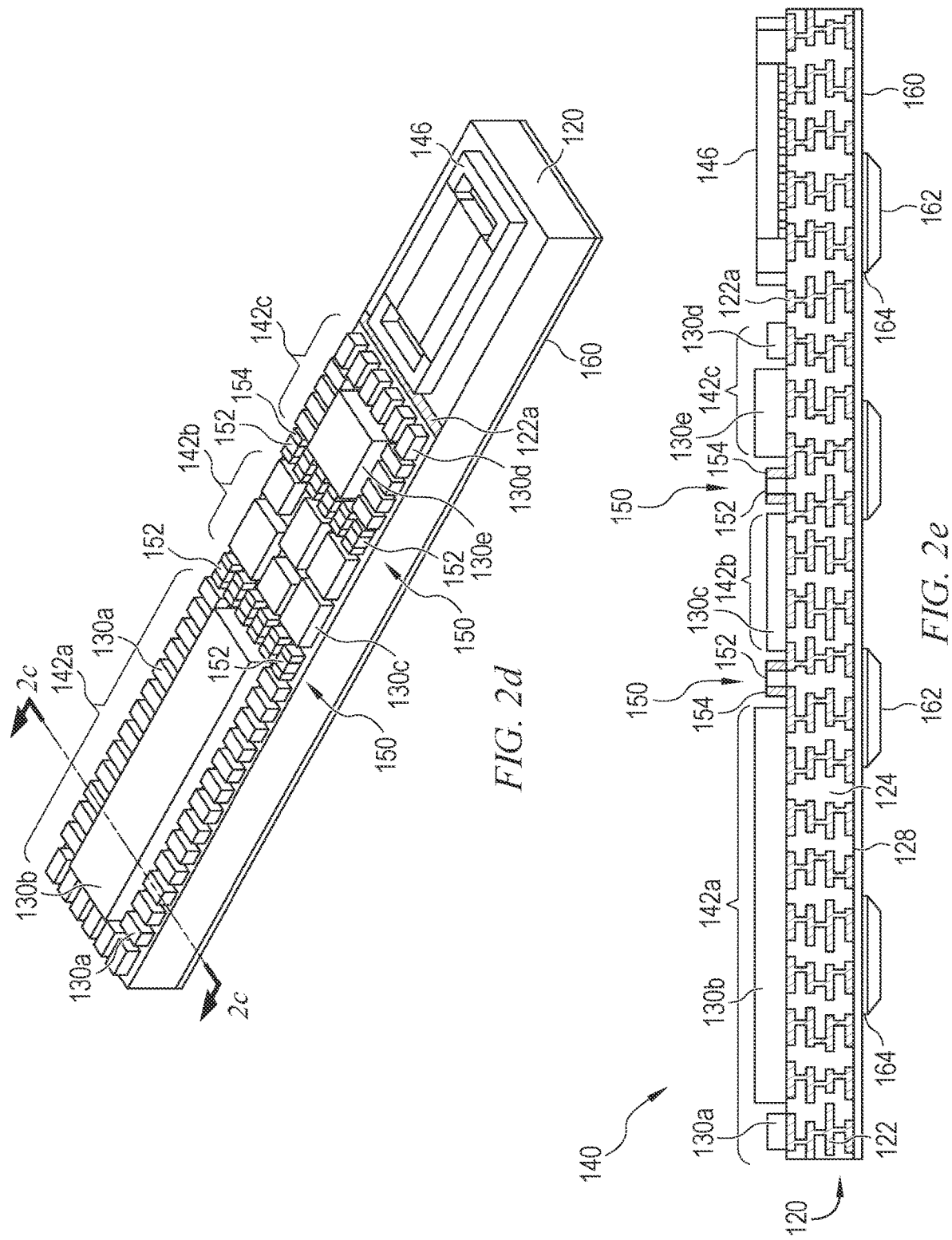

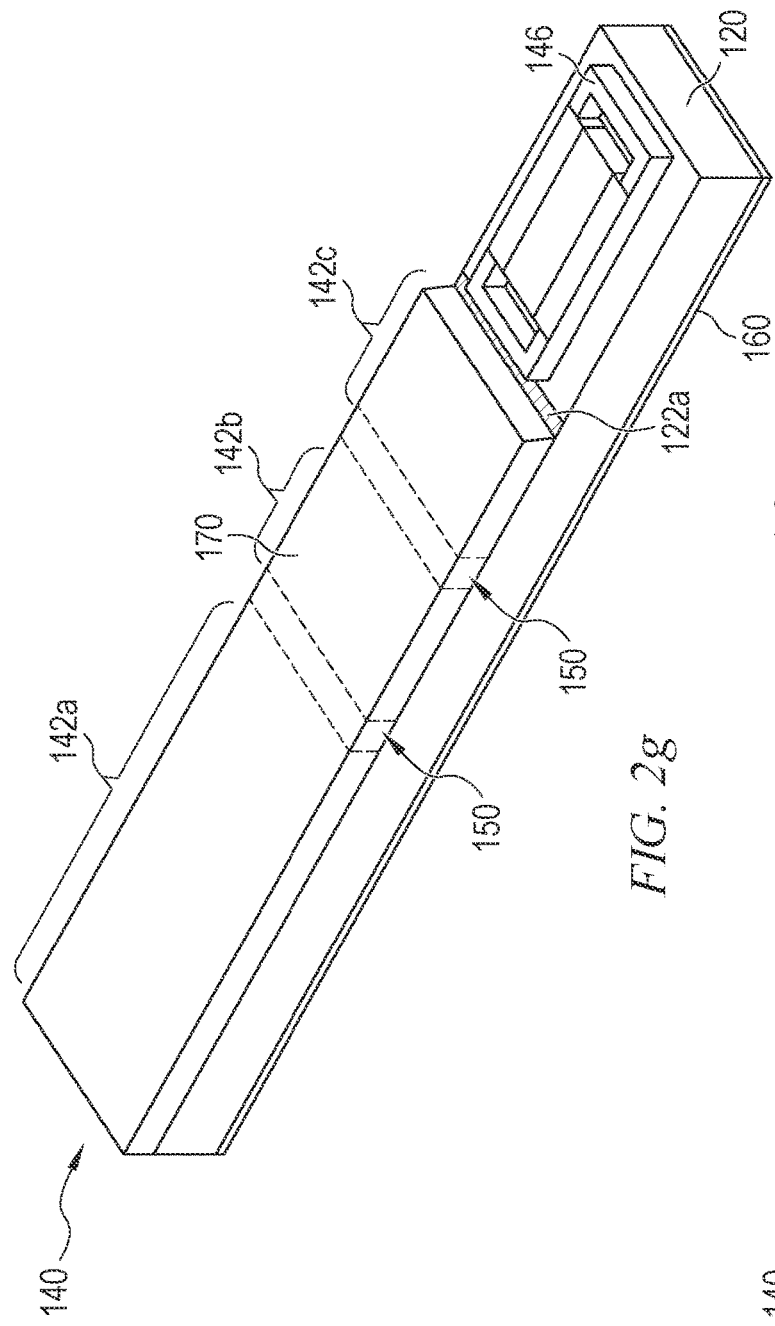
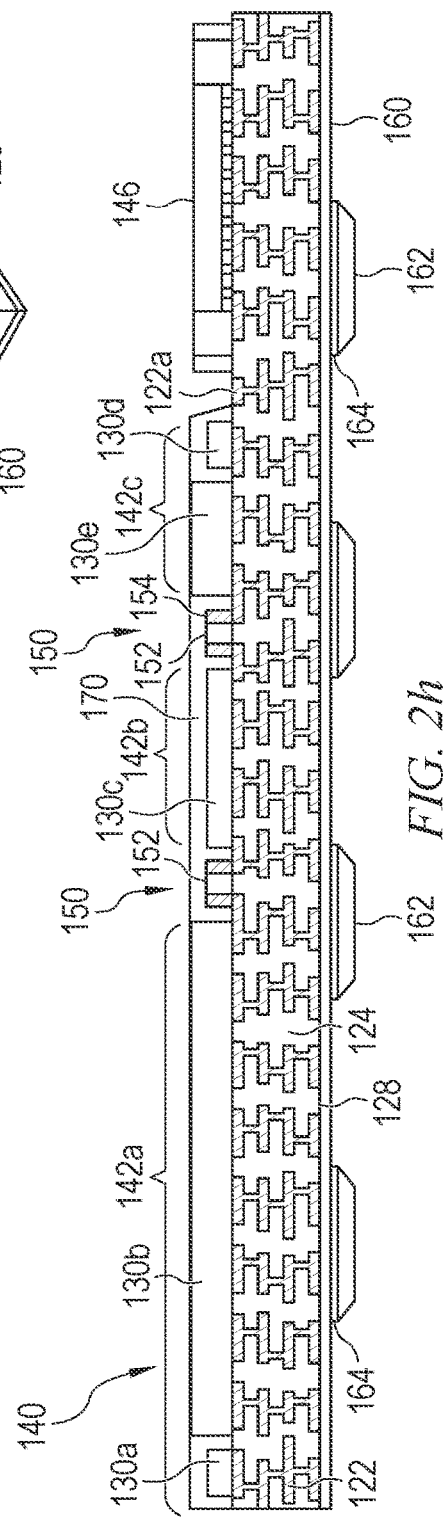
FIG. 2g
FIG. 2h

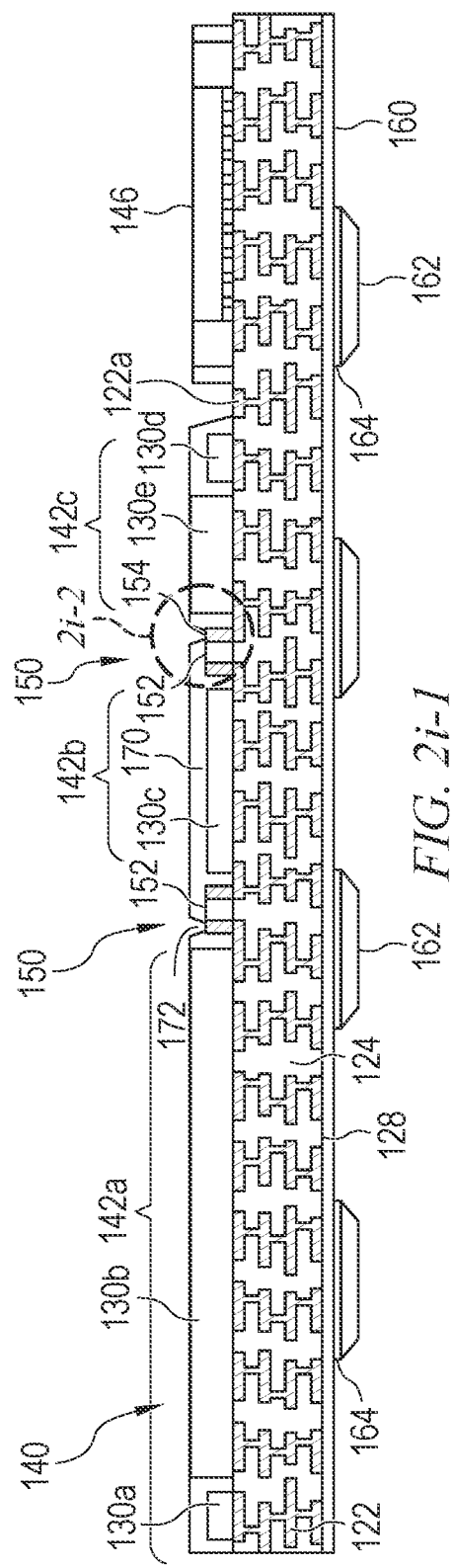
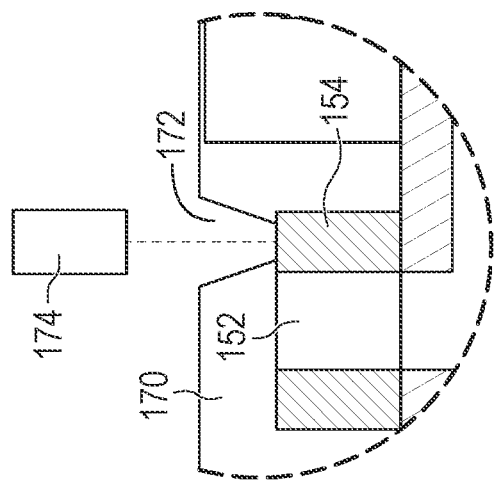
FIG. 2i-1
FIG. 2i-2

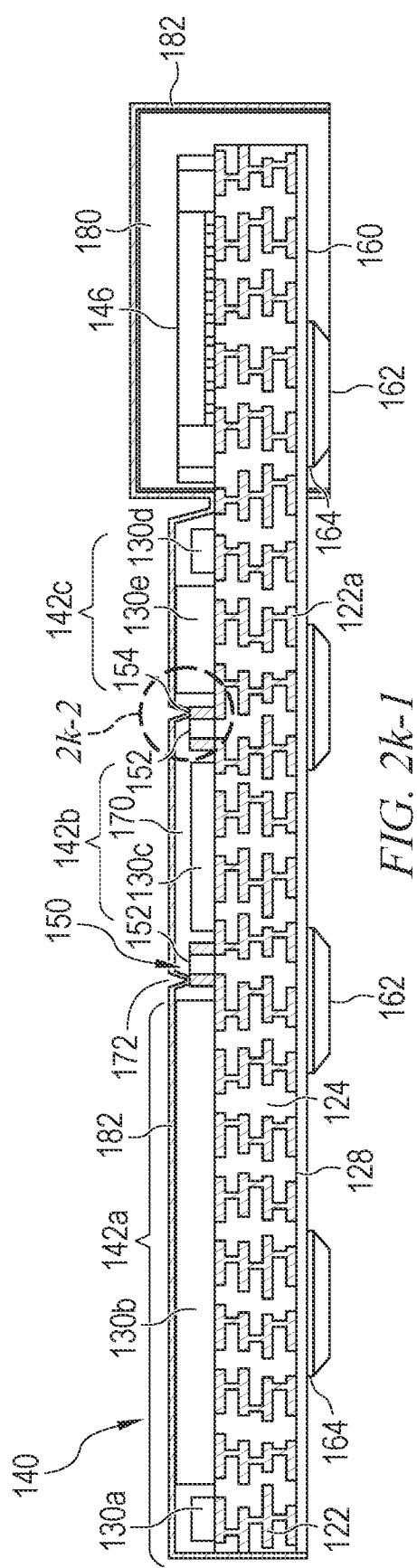
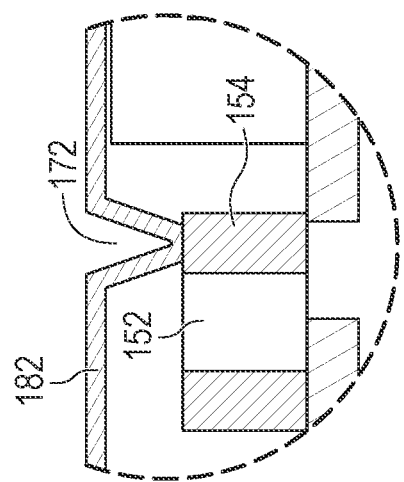
FIG. 2k-1
FIG. 2k-2

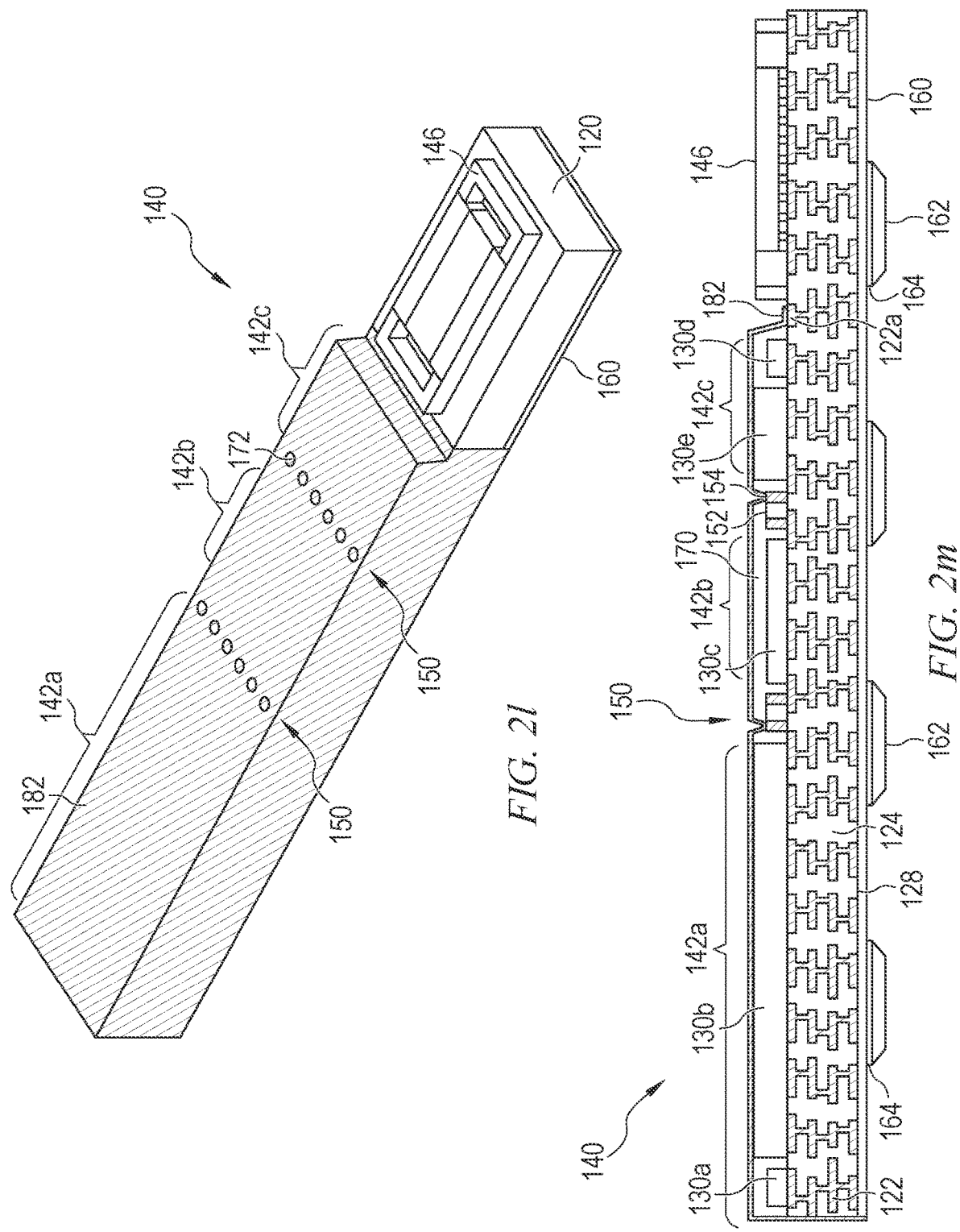

SEMICONDUCTOR DEVICE AND METHOD OF FORMING COMPARTMENT SHIELDING FOR A SEMICONDUCTOR PACKAGE

FIELD OF THE INVENTION

The present invention relates in general to semiconductor devices and, more particularly, to a semiconductor device and method of forming compartment shielding for a semiconductor package.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., multiple semiconductor die and a plethora of discrete components to support the semiconductor die, disposed on a substrate to perform necessary electrical functions. Such a package is commonly referred to as a system-in-package (SiP) module. SiP modules and other semiconductor packages that include one or more antennae for transmitting and receiving electromagnetic signals are commonly called antennae-in-package (AiP) modules.

A common concern for SiP modules, AiP modules, and other types of packages is electromagnetic interference (EMI) between the components of the package. Compartment shielding can be formed between the various groups of components to shield them from each other. The compartment shielding typically extends horizontally to form a barrier between two different compartments of the semiconductor package and may extend vertically to be connected between a ground trace on the package's substrate and a shielding layer formed over the package.

Conventionally, the compartment shielding is formed by adding materials and steps during the manufacturing process, thus increasing the processing and material costs to manufacture a package. Therefore, a need exists for improved compartment shielding devices and methods.

BRIEF DESCRIPTION OF THE DRAWINGS

FIGS. 2a-2m illustrate forming a semiconductor package with compartment shielding.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
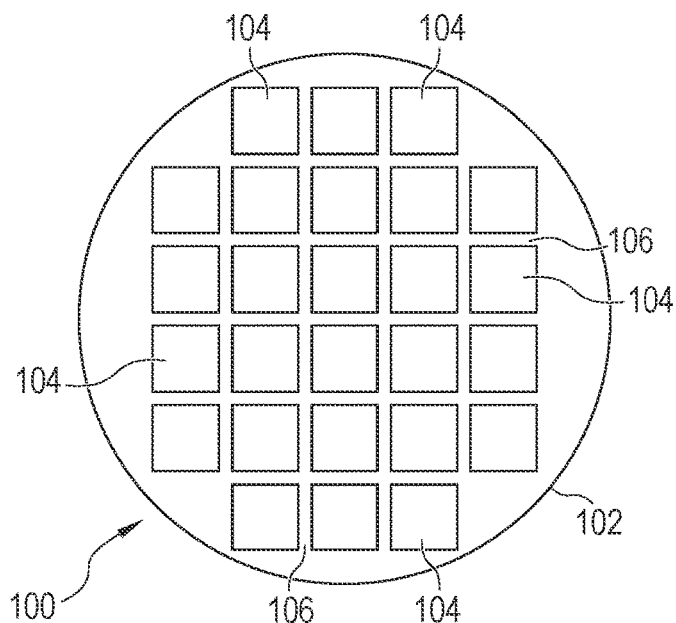
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
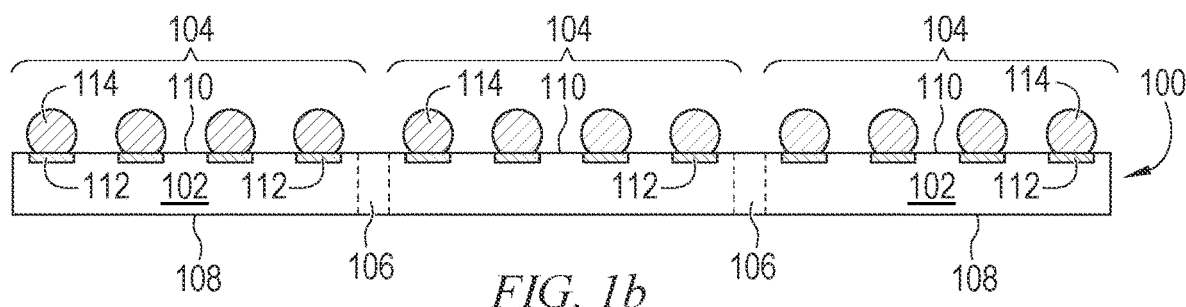

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
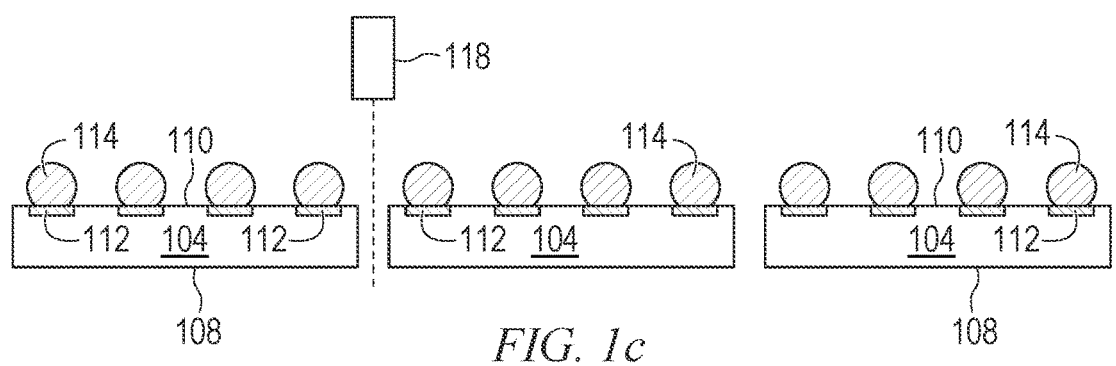

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2F:
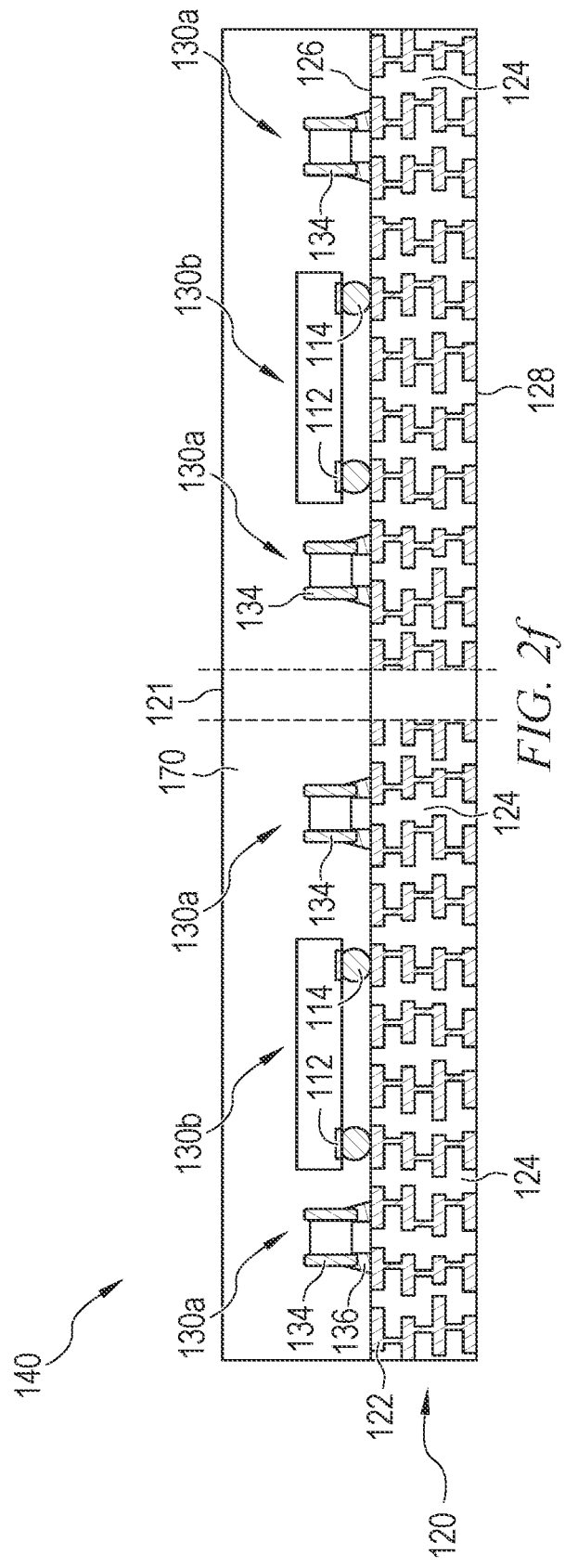

FIGS. 2a-2m illustrate a process of forming a semiconductor package with compartment shielding. FIG. 2a shows a cross-sectional view of multi-layered interconnect substrate 120 including conductive layers 122 and insulating layers 124. While only a single substrate 120 suitable to form two semiconductor packages separated by saw street 121 is shown, hundreds or thousands of units are commonly manufactured and processed as part of a single substrate before being singulated from each other, using the same steps described herein performed en masse. A separate substrate 120 could also be used for each unit being manufactured, the substrate being singulated before the steps shown in FIGS. 2a-2c and a plurality of individual substrates being placed on a common carrier for processing.

Conductive layers 122 can be one or more layers of Al, Cu, Sn, Ni, Au, Ag, or other suitable electrically conductive material. Conductive layers 122 can be formed using PVD, CVD, electrolytic plating, electroless plating, or other suitable metal deposition process. Conductive layers 122 provide horizontal electrical interconnect across substrate 120 and vertical electrical interconnect between top surface 126, bottom surface 128, and intermediate conductive layers. Portions of conductive layers 122 can be electrically common or electrically isolated depending on the design and function of the package being formed. In some embodiments where an AiP module is being formed, conductive layers 122 are patterned to form an antenna within substrate 120.

Insulating layers 124 contain one or more layers of silicon dioxide ($SiO_2$), silicon nitride ($Si_3N_4$), silicon oxynitride (SiON), tantalum pentoxide ($Ta2O5$), aluminum oxide ($Al_2O_3$), solder resist, polyimide, benzocyclobutene (BCB), polybenzoxazoles (PBO), and other material having similar insulating and structural properties. Insulating layers 124 can be formed using PVD, CVD, printing, lamination, spin coating, spray coating, sintering, thermal oxidation, or another suitable process. Insulating layers 124 provide isolation between conductive layers 122. Any number of conductive layers 122 and insulating layers 124 can be interleaved over each other to form substrate 120. Any other suitable type of package substrate or leadframe is used for substrate 120 in other embodiments.

In FIG. 2b, electrical components 130a, 130b, and any other desired electrical components are disposed on top surface 126 of substrate 120 and electrically and mechanically connected to conductive layers 122. Electrical components 130 are positioned over substrate 120 using a pick and place operation. For example, electrical components 130a can be discrete electrical devices, such as diodes, transistors, resistors, capacitors, and inductors. Electrical components 130b can be, or be made similar to, semiconductor die 104 from FIG. 1c with bumps 114 oriented toward surface 126 of substrate 120. Alternatively, electrical components 130 can include any other desired semiconductor die, semiconductor packages, surface mount devices, RF components, or discrete electrical devices. Any of the electrical components 130 can also have integrated passive devices (IPDs) formed thereon.

Electrical components 130 are brought into contact with a conductive layer 122 on surface 126 of substrate 120. Terminals 134 of electrical components 130a are electrically and mechanically connected to conductive layer 122 using solder or conductive paste 136. Electrical components 130b are electrically and mechanically connected to conductive layer 122 by reflowing bumps 114. FIG. 2c illustrates electrical components 130 electrically and mechanically connected to conductive layers 122 of substrate 120. Any desired combination of electrical components of any suitable type can be used to form a semiconductor package on substrate 120. Electrical components can also be disposed over bottom surface 128 or within the layers of substrate 120.

FIG. 2d shows a wider perspective view of a semiconductor package 140 being formed with electrical components 130c, 130d, and 130e disposed on substrate 120 in addition to components 130a and 130b. Semiconductor package 140 is a system-in-package or antenna-in-package module in some embodiments. FIG. 2e shows another cross-sectional view with electrical components 130a-130e. Semiconductor package 140 is split into three compartments 142a, 142b, and 142c. Electrical components 130a and 130b are disposed within compartment 142a. Electrical components 130c are disposed within compartment 142b. Electrical components 130d and 130e are disposed within compartment 142c. Electrical components 130c and 130e are semiconductor die formed similar to semiconductor die 104. Electrical components 130d are discrete active or passive components similar to components 130a. Any combination of suitable electrical components can be disposed within compartments 142a-142c for any desired purpose.

Semiconductor package 140 also includes a board-to-board (B2B) connector 146 mounted on substrate 120 outside of compartments 142a-142c. B2B connector 146 is electrically and physically connected to substrate 120 using solder or solder paste in a similar manner to how electrical components 130 are mounted. B2B connector 146 allows an interconnect structure with a corresponding connector to snap into the B2B connector and thereby electrically connect another package or device to electronic components 130 of semiconductor package 140.

A portion of conductive layer 122 is optionally exposed between compartment 142c and B2B connector 146 as a ground line 122a. A conductive shielding layer to be formed over package 140 will be formed on ground line 122a to increase shielding performance.

Compartments 142a-142c contain electrical components 130 that may emit EMI or benefit from being protected from EMI emitted by electrical components in the other compartments. Any of the compartments may emit or be susceptible to EMI. In one example that will be used hereinafter, electrical components 130c in compartment 142b contain IPDs that are susceptible to or generate EMI, RFI, harmonic distortion, and inter-device interference. For example, IPDs contained within electrical components 130c provide the electrical characteristics needed for high-frequency applications, such as resonators, high-pass filters, low-pass filters, band-pass filters, symmetric Hi-Q resonant transformers, and tuning capacitors. In another embodiment, electrical components 130c contain digital circuits switching at a high frequency, which could interfere with the operation of other IPDs or electrical components in compartments 142a and 142c. Compartment shields 150 are formed around or adjacent to compartment 142b to protect the components in compartments 142a and 142c from EMI generated by electrical components 130c.

As part of compartment shield 150, a plurality of zero-ohm (0Ω) resistors 152 is disposed between compartment 142b and compartments 142a and 142c. A zero-ohm resistor is a surface-mount component with two terminals 154, similar to electrical components 130a and 130d with terminals 134, that essentially acts as a short-circuit between the two terminals. While a zero-ohm resistor is not literally without resistance, as that would be a physical impossibility, a zero-ohm resistor has as small of resistance as is feasible. Utilizing zero-ohm resistors 152 for compartment shield 150 reduces manufacturing cost and complexity because the zero-ohm resistors can be handled, placed, and installed in the same way as the other components 130 that are already being used for semiconductor package 140.

Terminals 154 of zero-ohm resistors 152 are physically and electrically connected to underlying ground pads of conductive layer 122 to improve EMI shielding performance in some embodiments. Conductive layer 122 is routed to both, only one, or neither one of terminals 154 of each zero-ohm resistor 152 in various embodiments. In one embodiment, zero-ohm resistors 152 are attached to substrate 120 using an adhesive without a direct electrical or physical connection to conductive layer 122.

Zero-ohm resistors allow either terminal 154 on either side of the zero-ohm resistor to be used in an equivalent manner, which adds flexibility to routing conductive layers 122. Any surface mount component could be used in an equivalent manner to zero-ohm resistors 152, in which case the same terminal that is coupled to ground traces of conductive layers 122 would more suitably be coupled to the shielding layer to be formed over package 140. For instance, instead of a zero-ohm resistor, a capacitor or diode to ground could be used with the overlying shielding layer connected to ground through the same terminal of the capacitor or diode that already needs to be connected to ground per the circuit design of the particular semiconductor package 140 being manufactured.

Each individual zero-ohm resistor 152 is oriented such that one of its terminals 154 is oriented toward compartment 152b, or, more generally, any area of a semiconductor package that is expected to generate EMI, and the second terminal 154 is oriented in the opposite direction, i.e., away from compartment 142b and toward compartment 142a or 142c to be protected. As a group, zero-ohm resistors are lined up between compartments as an EMI barrier. Zero-ohm resistors 152 are distributed linearly along a path between compartments 142 in the illustrated embodiments, but the zero-ohm resistors can be disposed along any desired path adjacent to or around an EMI emitting region or a region to be protected from EMI, including paths that have corners or curves. The path for compartment shields 150 can extend completely around or only partially around electrical components 130c. Zero-ohm resistors 152 are disposed along the desired path for compartment shields 150 between compartments 142a-142c. Zero-ohm resistors 152 extending perpendicular to the path for compartment shields 150, as illustrated, has the added benefit of increasing the thickness of grounded material between compartments 142. In other embodiments, zero-ohm resistors 152 are oriented parallel to the path of compartment shields 150, e.g., lined up end-to-end or terminal-to-terminal.

A passivation layer 160 is optionally formed on bottom surface 128 of substrate 120. Passivation layer 160 can be formed of the same material and in the same process as insulating layers 124, or any other suitable process and material. Feet 162 are optionally attached onto the bottom of substrate 120, either directly onto bottom surface 128 or on passivation layer 160 if used. Feet 162 are formed using any any suitable method and material, typically a molded polymer material. Feet 162 are attached to substrate 120 using an adhesive 164.

In FIGS. 2f-2h, encapsulant or molding compound 170 is deposited over and around electrical components 130a-130e and substrate 120 using a paste printing, compressive molding, transfer molding, liquid encapsulant molding, vacuum lamination, spin coating, or other suitable applicator. Encapsulant 170 can be liquid or granular polymer composite material, such as epoxy resin, epoxy acrylate, or polymer, with or without a filler. Encapsulant 170 is non-conductive, provides structural support, and environmentally protects the semiconductor device from external elements and contaminants.

FIGS. 2g and 2h show B2B connector 146 remains exposed from encapsulant 170 for subsequent attachment of a ribbon cable or other interconnect structure with a corresponding connector. Encapsulant 170 is molded onto compartments 142a-142c without extending over B2B connector 146 by using a mold chase that protects the B2B connector within a separate compartment of the mold or by any other suitable means. Ground line 122a also remains exposed from and outside of encapsulant 170. Encapsulant 170 completely covers electrical components 130a-130e. In other embodiments, select electrical components 130 can be exposed at the top surface of encapsulant 170 by using film-assisted molding or by backgrinding the encapsulant after molding.

In FIG. 2i, laser ablation is used to form openings 172 through encapsulant 170 and expose a portion of a terminal 154 for each zero-ohm resistor 152. FIG. 2i-1 is a cross-section of semiconductor package 140 as a whole, while FIG. 2i-2 is a detailed cross-section of one zero-ohm resistor 152 with opening 172 being formed by laser ablation with laser 174. Openings 172 are formed in a line between the middle compartment 142b and compartments 142a and 142c. Although laser ablation is preferred, mechanical drilling, chemical etching, or another suitable process is used to form openings 172 in other embodiments. While not necessary to form an opening 172 over each and every zero-ohm resistor 152, doing so forms a regular series of openings for compartment shield 150 with a tighter spacing than, e.g., forming an opening over only every-other zero-ohm resistor or skipping one or two.

Figure 2J:
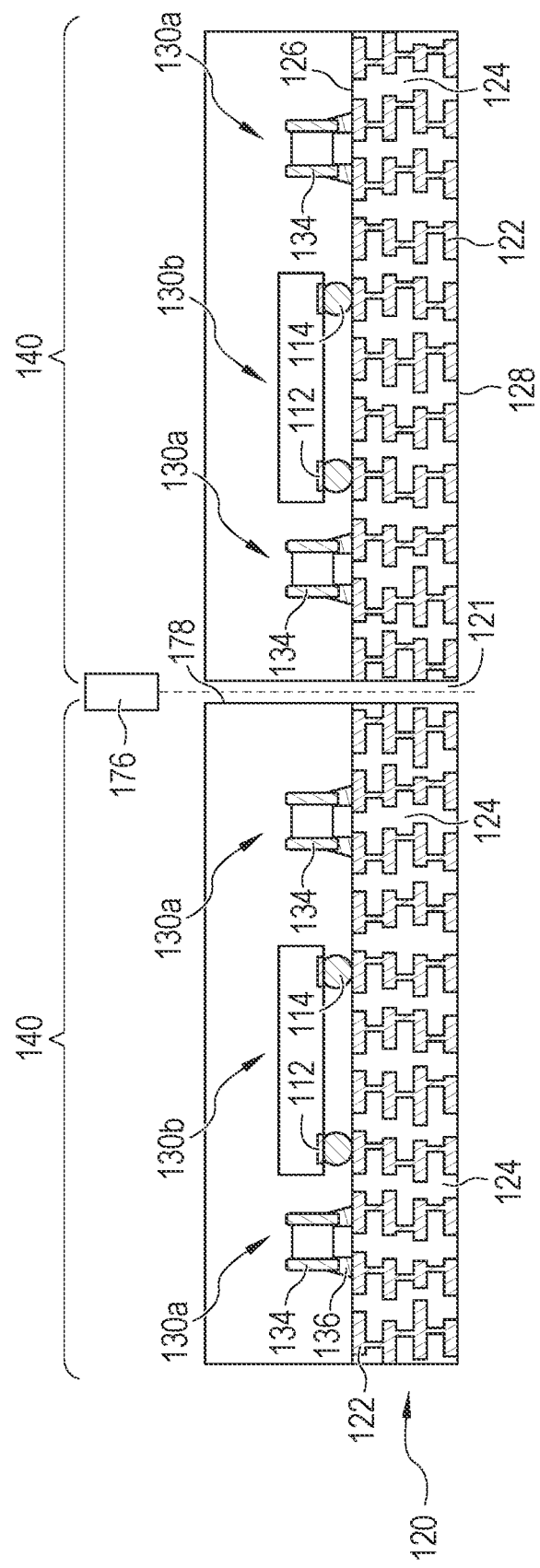

In most embodiments, substrate 120 and encapsulant 170 form a panel of semiconductor packages 140 with electrical components 130. In FIG. 2j, the panel is singulated using saw blade or laser cutting tool 176 into individual semiconductor packages 140. The singulation exposes side surfaces 178 of each semiconductor package 140. Singulation can occur at any stage of manufacturing.

In FIG. 2k, shielding layer 182 is deposited, printed, sputtered, plated, or otherwise formed over semiconductor package 140. FIG. 2k-1 shows an entire cross-sectional view of a semiconductor package 140 while FIG. 2k-2 shows a detailed cross-section of a single zero-ohm resistor 152. Plating can be performed by CVD, PVD, other sputtering methods, electroless plating, or other suitable metal deposition process. Depending on the specific deposition technique used, openings 172 may be conformally coated as illustrated, or the openings may be completely filled with conductive material. Shielding layer 182 includes one or more layers of Al, Cu, Sn, Ni, Au, Ag, or other suitable electrically conductive material. Shielding layer 182 totally covers top and side surfaces of encapsulant 170.

A mask 182 is disposed over B2B connector 146 and the portion of substrate 120 with the B2B connector thereon in order to block shielding layer 182 from being formed on the B2B connector. The end of substrate 120 with B2B connector 146 also remains free of shielding layer 182 because of mask 180. Shielding layer 182 is formed on mask 180 instead of the underlying portion of substrate 120. A lateral gap exists between encapsulant 170 and mask 182, where a portion of substrate 120 with ground line 122a is exposed. The gap allows shielding layer 182 to be formed directly contacting, and thereby electrically connected to, ground line 122a. Shielding layer 182 also extends down side surfaces 178 and contacts side surfaces of substrate 120 including an exposed portion of conductive layer 122 in some embodiments to improve grounding of the shielding layer.

FIGS. 2l and 2m show a completed semiconductor package 140 with shielding layer 182 formed and mask 180 removed along with the portion of the shielding layer formed on the mask. Mask 180 can be removed with the same pick-and-place machine or other mechanism that was used to dispose the mask over semiconductor package 140. Mask 180 can be reused on another package. Shielding layer 182 completely covers the top and side surfaces of encapsulant 170 to provide EMI shielding for compartments 142 as a group. In addition, shielding layer 182 extends into openings 172 between compartments 142a-142c to shield the compartments from each other. In combination with zero-ohm resistors 152, shielding layer 182 within openings 172 forms compartment shields 150.

Zero-ohm resistors 152 and shielding layer 182 in openings 172 stack to form a series of discrete vertically oriented shielding locations that are close enough to each other to form a horizontally oriented EMI barrier between compartments 142. The combination of shielding layer 182 on outer side surfaces and compartment shields 150 in the middle of package 140 completely surrounds each individual compartment 142a-142c with EMI shielding. Compartment shields 150 are formed on two sides of compartment 142b because other components are formed on two sides of the middle compartment. In other embodiments, compartment shields 150 may be formed along only a single side of a compartment, extend along two adjacent sides of a compartment, completely surround a compartment, or be configured in any other suitable layout. Forming compartment shields 150 with zero-ohm resistors and shielding layer 182 reduces cost compared to prior art compartment shielding while providing EMI shielding between the compartments.

Figure 3A:
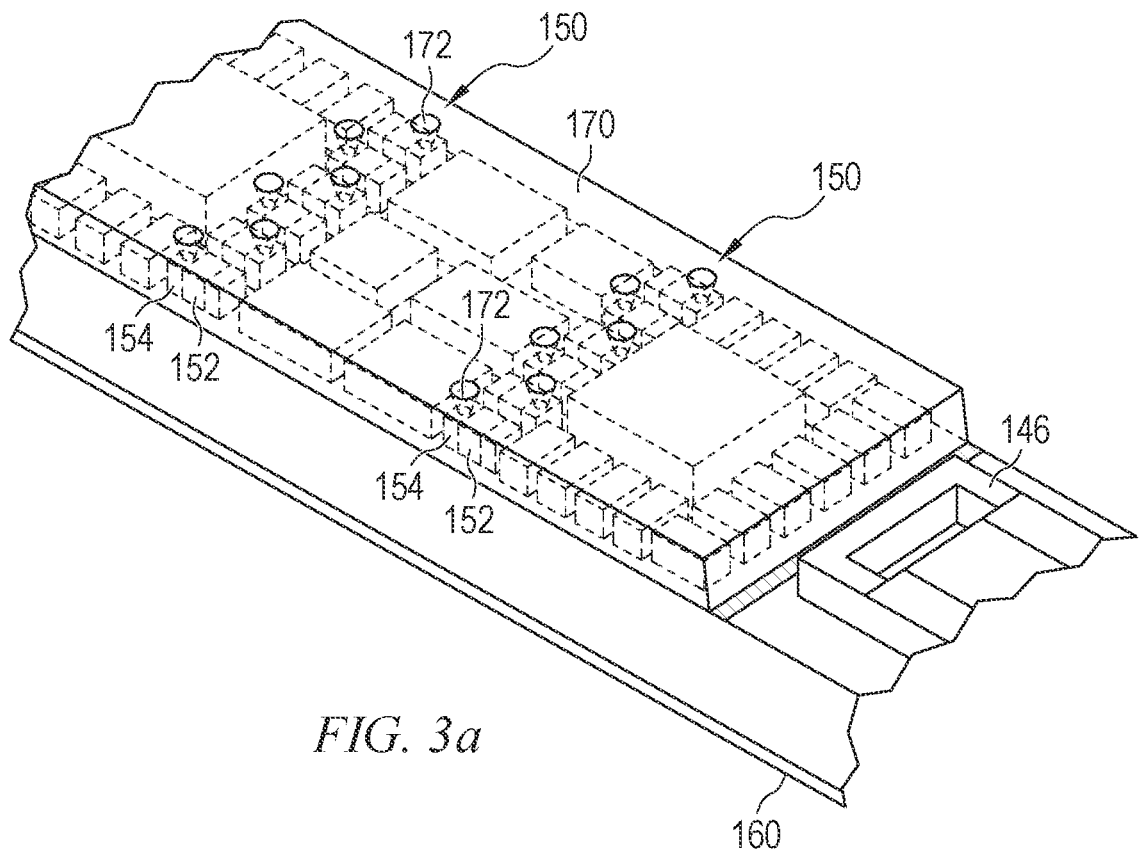
FIGS. 3a and 3b illustrate a second embodiment.
Figure 3B:
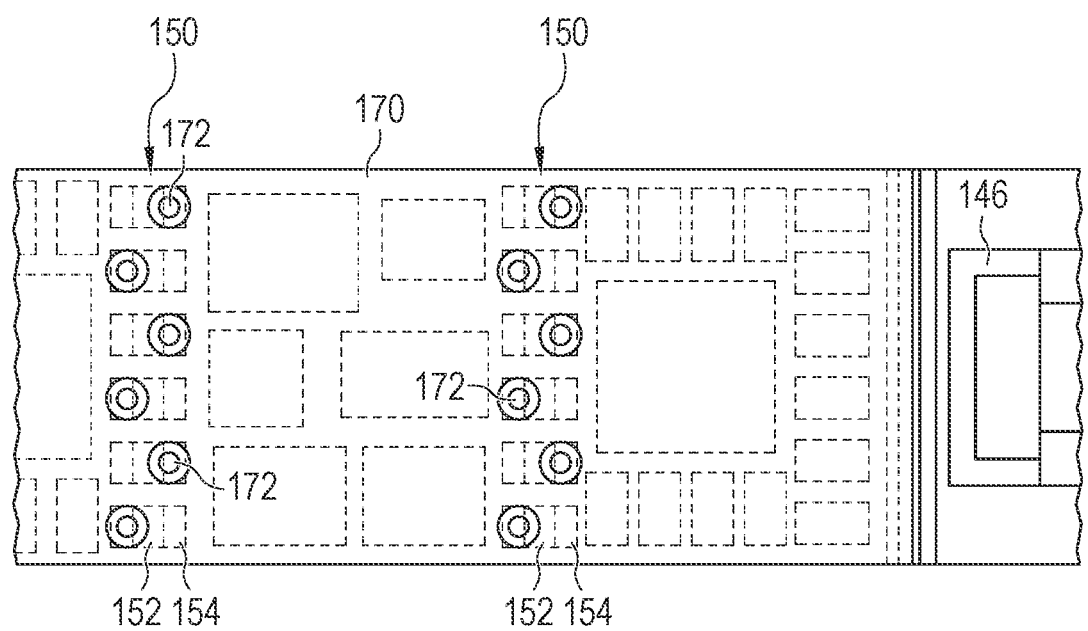

FIGS. 2a-2m show openings 172 being formed through encapsulant 170 over the terminal 154 oriented away from compartment 142b for each zero-ohm resistor 152. In other embodiments, openings 172 can be formed over the terminals 154 closest to compartment 142b instead of or in addition to the openings 172 shown in FIG. 2i-2. In one embodiment shown in FIGS. 3a and 3b, openings 172 are formed over terminals 154 in a zig-zag pattern, alternating between those closest to compartment 142b and those furthest from compartment 142b. In another embodiment, openings 172 are formed based on whichever terminal 154 of each zero-ohm resistor 152 is coupled to ground through conductive layer 122.

Figure 4A:
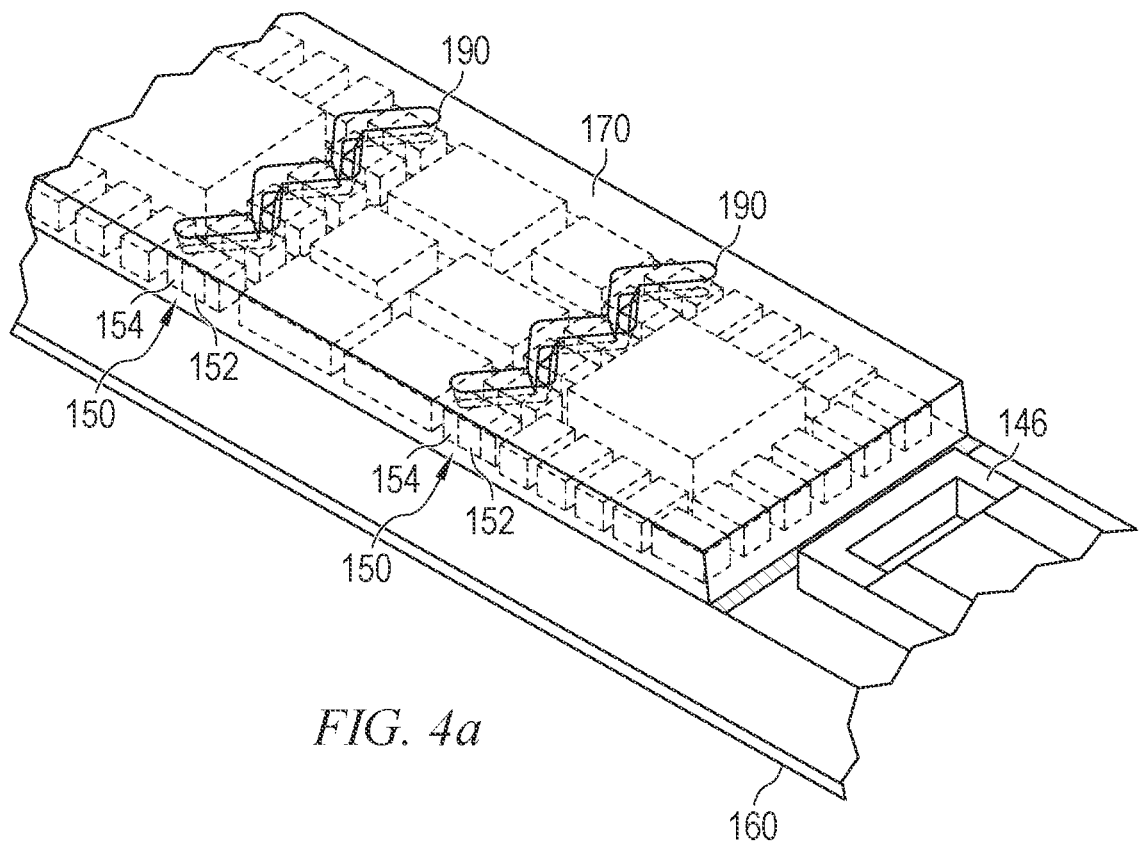
FIGS. 4a and 4b illustrate a third embodiment.
Figure 4B:
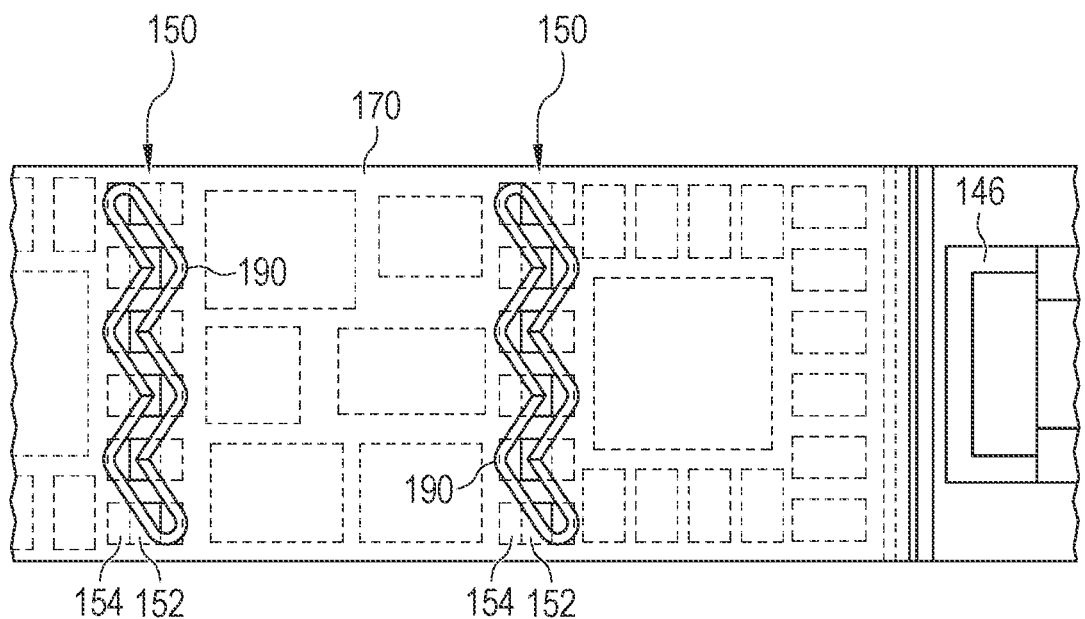

Instead of forming a plurality of discrete openings 172, with an opening over at least one terminal of each zero-ohm resistor 152, a trench or slot can be formed into encapsulant 170. FIGS. 4a and 4b show a trench 190 that connects each zero-ohm resistor 154 along the entire length of each compartment shield 150 in a zig-zag pattern similar to the discrete openings 172 in FIGS. 3a and 3b. Trench 190 extends continuously to each zero-ohm resistor in each compartment shield 150. The zig-zag pattern of trenches 190 means that each trench goes from the terminal 154 nearest to compartment 142b on one zero-ohm resistor 152 to the terminal furthest from compartment 142b of adjacent zero-ohm resistor or resistors and vice-versa. The path of trench 190 can move back and forth to overlie each terminal 154 of each zero-ohm resistor 152 that is connected to ground rather than strictly alternating back and forth.

Figure 5A:
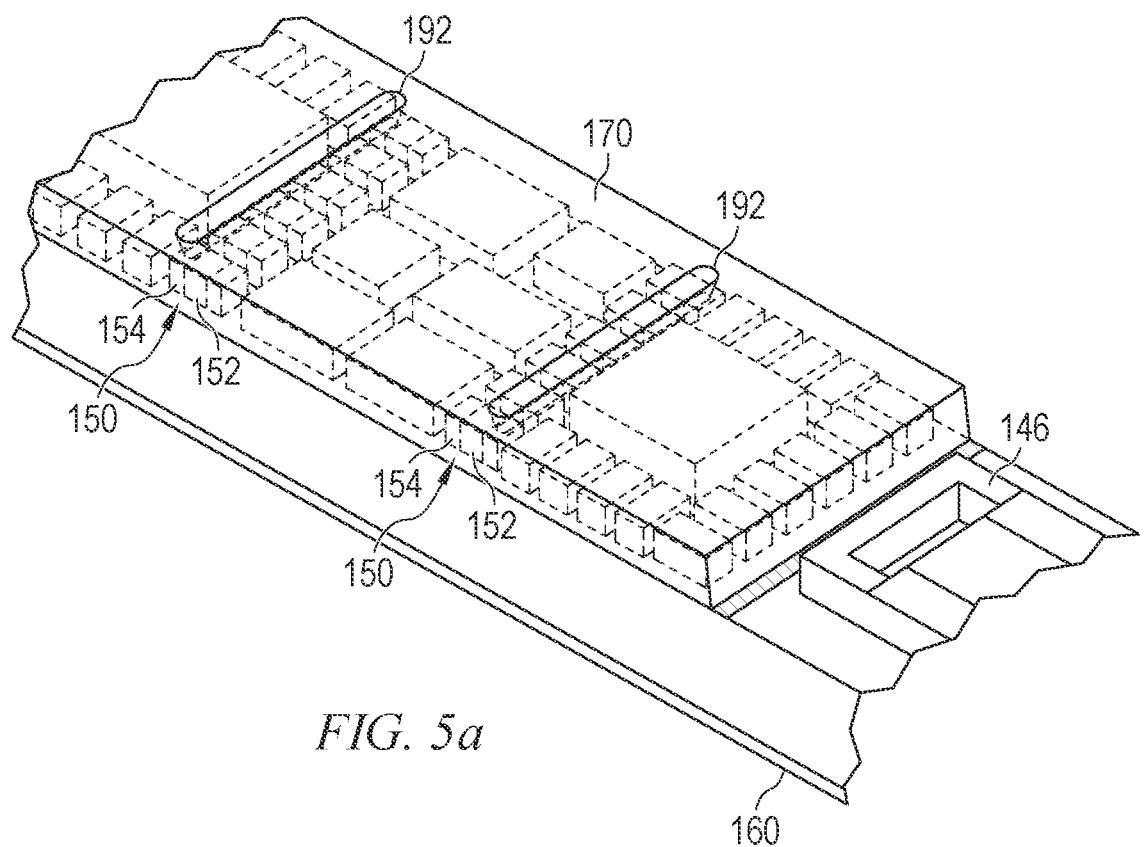
FIGS. 5a and 5b illustrate a fourth embodiment.
Figure 5B:
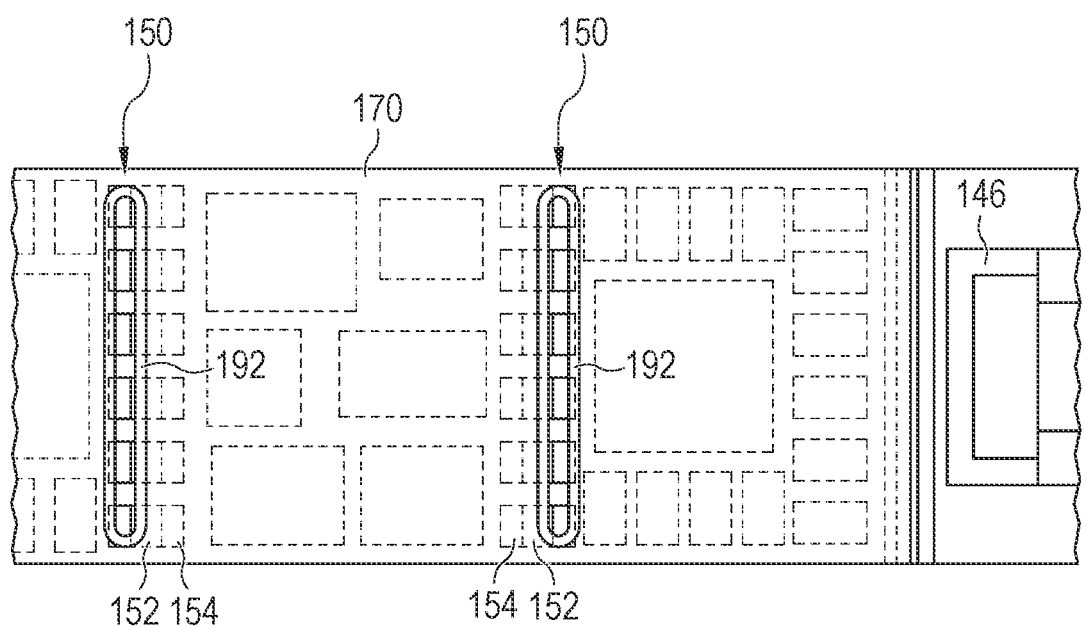

Alternatively, a linear trench 192 that extends to the same terminal 154 of each zero-ohm resistor 152 can be used as shown in FIGS. 5a and 5b. Forming a trench to expose terminals 154 instead of discrete openings 172 increase lateral shielding by providing additional coverage for the vertical wall of grounded conductive material between compartments. Trenches 190 or 192 can be formed by laser ablation, chemical etching, or mechanical etching as with openings 172.

Figure 6:
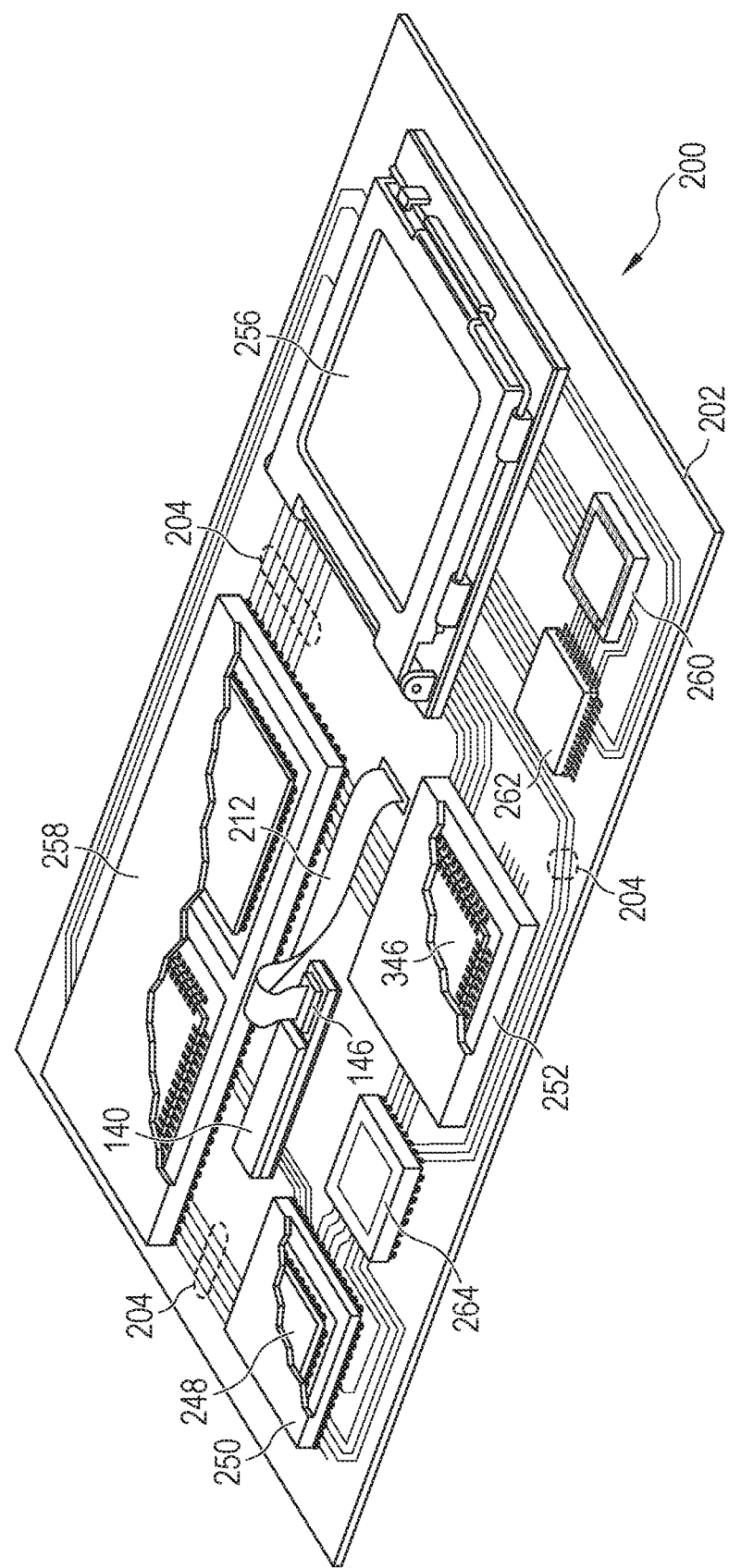
FIG. 6 illustrates an electronic device with different types of packages disposed on a printed circuit board (PCB).

FIG. 6 illustrates integrating the above-described semiconductor packages, e.g., semiconductor package 140, into a larger electronic device 200. Electronic device 200 includes PCB 202 with a plurality of semiconductor packages mounted on a surface of the PCB, including semiconductor package 140. In one embodiment, electronic device 200 is a mobile phone and PCB 202 is the main board or sub assembly of the phone. Semiconductor package 140 is mounted using a liquid adhesive, adhesive tape, or other suitable means to attach the package to substrate 202. Feet 162 help the adhesive grip semiconductor package 140. In other embodiments, adhesive is applied directly to substrate 120 or passivation layer 160. A ribbon cable 212 has a connector that snaps into B2B connector 146. Ribbon cable 212 routes electrical signals through to another B2B connector on substrate 202 or to another package mounted to the substrate. Electrical components 130 are electrically coupled to PCB 202 through substrate 120, B2B connector 146, and ribbon cable 212.

Electronic device 200 can have one type of semiconductor package, or multiple types of semiconductor packages, depending on the application. Electronic device 200 can be a stand-alone system that uses the semiconductor packages to perform one or more electrical functions. Alternatively, electronic device 200 can be a subcomponent of a larger system. For example, electronic device 200 can be part of a tablet computer, cellular phone, digital camera, communication system, or other electronic device. Electronic device 200 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6, PCB 202 provides a general substrate for structural support and electrical interconnection of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between the semiconductor packages, mounted components, and other external systems or components. Traces 204 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 202. In other embodiments, a semiconductor device may only have the first level packaging where the die is mechanically and electrically mounted directly to PCB 202.

For the purpose of illustration, several types of first level packaging, including bond wire package 246 and flipchip 248, are shown on PCB 202. Additionally, several types of second level packaging, including ball grid array (BGA) 250, bump chip carrier (BCC) 252, land grid array (LGA) 256, multi-chip module (MCM) 258, quad flat non-leaded package (QFN) 260, quad flat package 262, and embedded wafer level ball grid array (eWLB) 264 are shown mounted on PCB 202 along with semiconductor package 140. Conductive traces 204 electrically couple the various packages and components disposed on PCB 202 to semiconductor package 140, giving use of electrical components 130 to other components on the PCB.

Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a first electrical component disposed over the substrate;
   a second electrical component disposed over the substrate;
   a first resistor disposed over the substrate between the first electrical component and second electrical component;
   a second resistor disposed over the substrate between the first electrical component and second electrical component
   an encapsulant deposited over the substrate, first electrical component, second electrical component, and first resistor;
   an opening formed through the encapsulant to the first resistor;
   a second opening formed through the encapsulant to the second resistor; and
   a shielding layer formed over the encapsulant and into the opening.

2. The semiconductor device of claim 1, wherein the opening extends from the first resistor to the second resistor.

3. The semiconductor device of claim 1, further including a third electrical component disposed over the substrate with the second electrical component between the first electrical component and third electrical component, wherein the second resistor is disposed between the second electrical component and third electrical component.

4. The semiconductor device of claim 1, further including:
   a series of first resistors disposed adjacent to the first electrical component; and
   an opening formed over each of the first resistors.

5. A semiconductor device, comprising:
   a substrate;
   a series of first resistors disposed along a path over the substrate;
   an encapsulant deposited over the substrate and series of first resistors;
   an opening formed through the encapsulant to the series of first resistors; and
   a shielding layer formed over the encapsulant and into the opening.

6. The semiconductor device of claim 5, further including a second resistor disposed over the substrate.

7. The semiconductor device of claim 6, further including a second opening formed through the encapsulant to the second resistor.

8. The semiconductor device of claim 6, wherein the opening extends from the first resistor to the second resistor.

9. The semiconductor device of claim 5, further including a separate opening formed over each of the first resistors individually.

10. The semiconductor device of claim 5, wherein the opening is formed in a zig-zag pattern over the first resistors.

11. A method of making a semiconductor device, comprising:
    providing a substrate;
    disposing a first electrical component over the substrate;
    disposing a second electrical component over the substrate;
    disposing a series of first resistors over the substrate between the first electrical component and second electrical component;
    depositing an encapsulant over the substrate, first electrical component, second electrical component, and first resistor;

forming a plurality of openings through the encapsulant to the series of first resistors, wherein a separate opening is formed over each of the first resistors; and forming a shielding layer over the encapsulant and into the opening.

12. The method of claim 11, further including disposing a second resistor over the substrate between the first electrical component and second electrical component.

13. The method of claim 12, further including forming a second opening through the encapsulant to the second resistor.

14. The method of claim 12, further including forming the opening extending from the first resistor to the second resistor.

15. The method of claim 11, further including:
disposing a third electrical component over the substrate with the second electrical component between the first electrical component and third electrical component;
disposing a second resistor between the second electrical component and third electrical component; and
forming a second opening through the encapsulant to the second resistor.

16. A method of making a semiconductor device, comprising:
providing a substrate;
disposing a first resistor over the substrate;
disposing a second resistor over the substrate depositing an encapsulant over the substrate and first resistor;
forming an opening through the encapsulant to the first resistor;
forming a second opening through the encapsulant to the second resistor; and
forming a shielding layer over the encapsulant and into the opening.

17. The method of claim 16, further including forming the opening extending from the first resistor to the second resistor.

18. The method of claim 16, further including:
disposing a series of first resistors along a path; and
forming a separate opening over each of the first resistors.

19. The method of claim 16, further including:
disposing a series of first resistors along a path; and
forming the opening as a slot extending to each of the first resistors.

* * * * *